United States Patent
Chi et al.

(10) Patent No.: US 10,903,183 B2
(45) Date of Patent: Jan. 26, 2021

(54) SEMICONDUCTOR DEVICE AND METHOD OF USING LEADFRAME BODIES TO FORM OPENINGS THROUGH ENCAPSULANT FOR VERTICAL INTERCONNECT OF SEMICONDUCTOR DIE

(71) Applicant: JCET Semiconductor (Shaoxing) Co., Ltd., Shaoxing (CN)

(72) Inventors: HeeJo Chi, Kyoungki-do (KR); NamJu Cho, Gyeonggi-do (KR); HanGil Shin, Seoul (KR)

(73) Assignee: JCET Semiconductor (Shaoxing) Co., Ltd.

( * ) Notice: Subject to any disclaimer, the term of this patent is extended or adjusted under 35 U.S.C. 154(b) by 238 days.

(21) Appl. No.: 14/466,923

(22) Filed: Aug. 22, 2014

(65) Prior Publication Data

US 2014/0361423 A1 Dec. 11, 2014

Related U.S. Application Data

(60) Continuation of application No. 13/609,050, filed on Sep. 10, 2012, now abandoned, which is a division of
(Continued)

(51) Int. Cl.
*H01L 23/00* (2006.01)
*H01L 23/538* (2006.01)
(Continued)

(52) U.S. Cl.
CPC .......... *H01L 24/17* (2013.01); *H01L 21/4832* (2013.01); *H01L 23/3121* (2013.01);
(Continued)

(58) Field of Classification Search
CPC .............. H01L 21/568; H01L 23/5389; H01L 2224/24227; H01L 2924/15153; H01L 23/3121; H01L 24/19
See application file for complete search history.

(56) References Cited

U.S. PATENT DOCUMENTS 5,111,278 A * 5/1992 Eichelberger ................. 257/698
5,907,189 A 5/1999 Mertol
(Continued)

FOREIGN PATENT DOCUMENTS

CN 101814474 A 8/2010
TW 201113963 A 4/2011

*Primary Examiner* — Thao X Le
*Assistant Examiner* — Laura M Dykes
(74) *Attorney, Agent, or Firm* — Robert D. Atkins; Patent Law Group: Atkins and Associates, P.C.

(57) ABSTRACT

A semiconductor device has a leadframe with a plurality of bodies extending from the base plate. A first semiconductor die is mounted to the base plate of the leadframe between the bodies. An encapsulant is deposited over the first semiconductor die and base plate and around the bodies of the leadframe. A portion of the encapsulant over the bodies of the leadframe is removed to form first openings in the encapsulant that expose the bodies. An interconnect structure is formed over the encapsulant and extending into the first openings to the bodies of the leadframe. The leadframe and bodies are removed to form second openings in the encapsulant corresponding to space previously occupied by the bodies to expose the interconnect structure. A second semiconductor die is mounted over the first semiconductor die with bumps extending into the second openings of the encapsulant to electrically connect to the interconnect structure.

24 Claims, 13 Drawing Sheets

Related U.S. Application Data application No. 13/153,286, filed on Jun. 3, 2011, now Pat. No. 8,288,209.

(51) Int. Cl.
| | | |
|---|---|---|
| *H01L 23/498* | (2006.01) | |
| *H01L 21/48* | (2006.01) | |
| *H01L 23/31* | (2006.01) | |
| *H01L 23/552* | (2006.01) | |
| *H01L 25/16* | (2006.01) | |

(52) U.S. Cl.
CPC .... *H01L 23/3157* (2013.01); *H01L 23/49816* (2013.01); *H01L 23/5389* (2013.01); *H01L 23/552* (2013.01); *H01L 24/19* (2013.01); *H01L 24/20* (2013.01); *H01L 24/33* (2013.01); *H01L 24/97* (2013.01); *H01L 25/16* (2013.01); *H01L 2223/6677* (2013.01); *H01L 2224/0401* (2013.01); *H01L 2224/04105* (2013.01); *H01L 2224/12105* (2013.01); *H01L 2224/16145* (2013.01); *H01L 2224/16225* (2013.01); *H01L 2224/32145* (2013.01); *H01L 2224/32225* (2013.01); *H01L 2224/32245* (2013.01); *H01L 2224/48091* (2013.01); *H01L 2224/73253* (2013.01); *H01L 2224/73259* (2013.01); *H01L 2224/73265* (2013.01); *H01L 2224/73267* (2013.01); *H01L 2225/06513* (2013.01); *H01L 2225/06517* (2013.01); *H01L 2225/06541* (2013.01); *H01L 2225/1029* (2013.01); *H01L 2225/1035* (2013.01); *H01L 2924/0103* (2013.01); *H01L 2924/014* (2013.01); *H01L 2924/01006* (2013.01); *H01L 2924/01013* (2013.01); *H01L 2924/01024* (2013.01); *H01L 2924/01029* (2013.01); *H01L 2924/01047* (2013.01); *H01L 2924/01049* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/12041* (2013.01); *H01L 2924/12042* (2013.01); *H01L 2924/1306* (2013.01); *H01L 2924/13091* (2013.01); *H01L 2924/15311* (2013.01); *H01L 2924/181* (2013.01); *H01L 2924/18161* (2013.01); *H01L 2924/18162* (2013.01); *H01L 2924/3011* (2013.01); *H01L 2924/3025* (2013.01); *H01L 2924/30107* (2013.01)

(56) References Cited

U.S. PATENT DOCUMENTS

| | | | |
|---|---|---|---|
| 7,737,539 | B2 | 6/2010 | Kwon et al. |
| 2004/0140573 | A1* | 7/2004 | Pu ................. H01L 23/3128 257/782 |
| 2005/0161833 | A1 | 7/2005 | Takeuchi et al. |
| 2006/0043611 | A1* | 3/2006 | Kinsman ............ H01L 23/13 257/784 |
| 2007/0018313 | A1 | 1/2007 | Gomyo et al. |
| 2008/0283996 | A1* | 11/2008 | O ..................... H01L 23/5389 257/690 |
| 2009/0039491 | A1* | 2/2009 | Kim .................. H01L 21/561 257/686 |
| 2009/0289356 | A1* | 11/2009 | Camacho ........... H01L 21/6835 257/737 |
| 2009/0315170 | A1 | 12/2009 | Shim et al. |
| 2010/0019381 | A1* | 1/2010 | Haeberlen ............ H01L 21/561 257/737 |
| 2010/0044842 | A1* | 2/2010 | Mengel et al. .............. 257/676 |
| 2010/0193928 | A1 | 8/2010 | Zudock et al. |
| 2010/0213588 | A1 | 8/2010 | Hsieh |
| 2010/0213589 | A1 | 8/2010 | Hsieh |
| 2010/0244216 | A1 | 9/2010 | Huang et al. |
| 2011/0037154 | A1 | 2/2011 | Shim et al. |
| 2011/0084382 | A1* | 4/2011 | Chen .................... H01 24/97 257/737 |
| 2011/0140259 | A1 | 6/2011 | Cho et al. |
| 2011/0291249 | A1 | 12/2011 | Chi et al. |
| 2012/0086117 | A1* | 4/2012 | Chang ............... H01L 23/49827 257/706 |

* cited by examiner

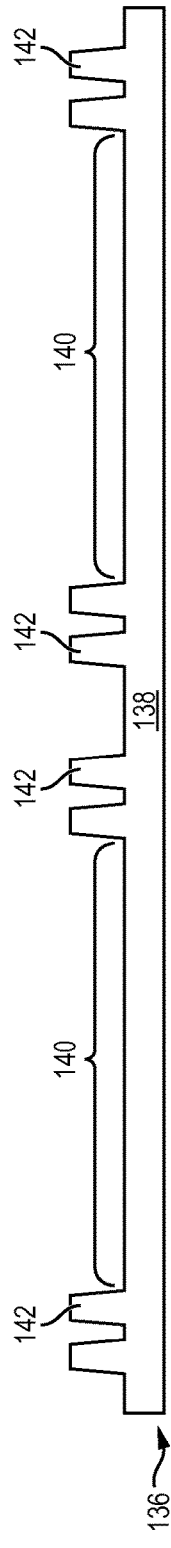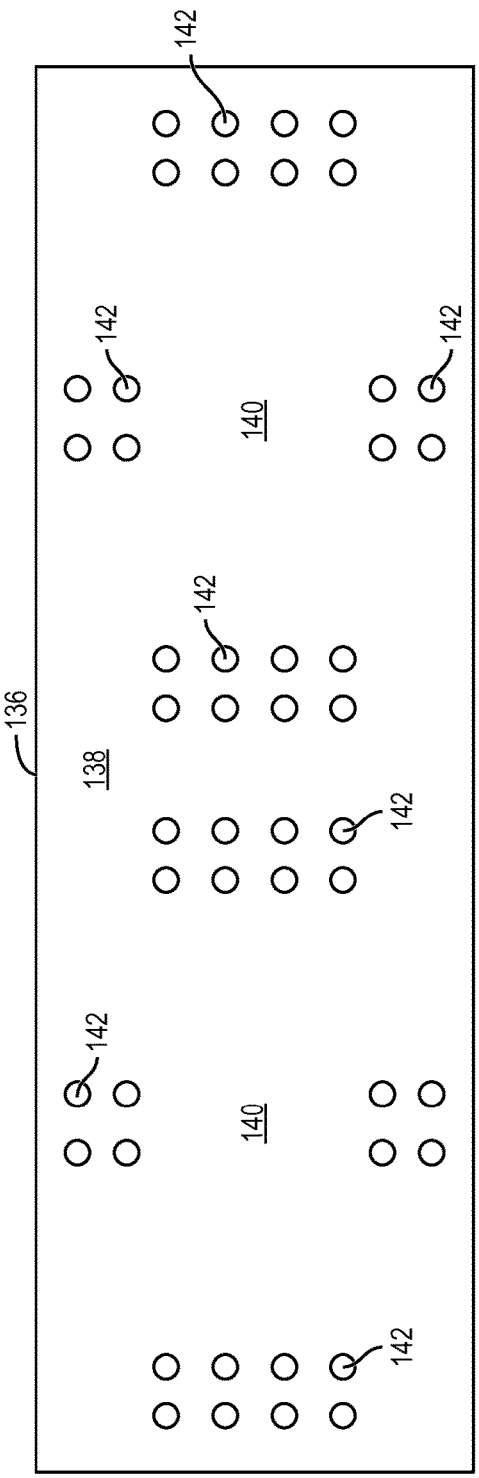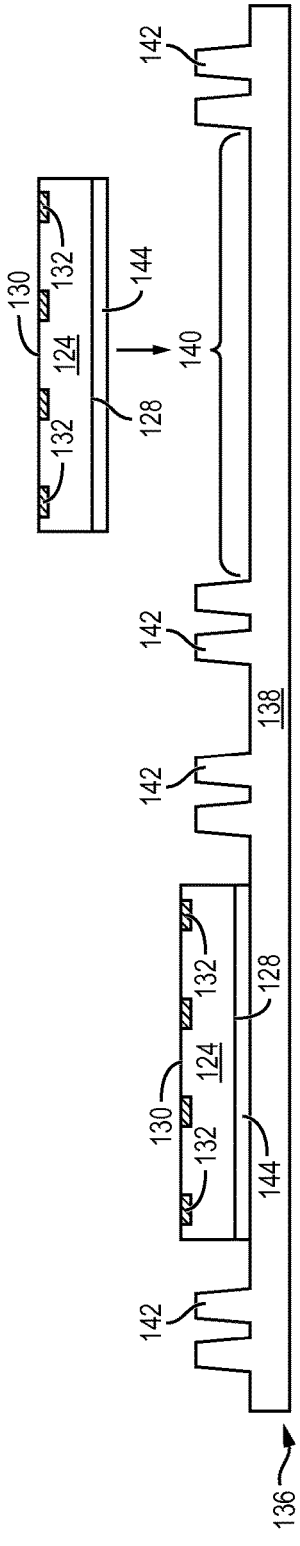

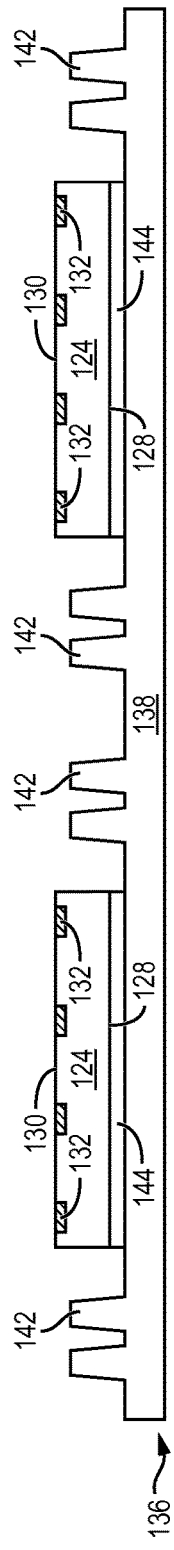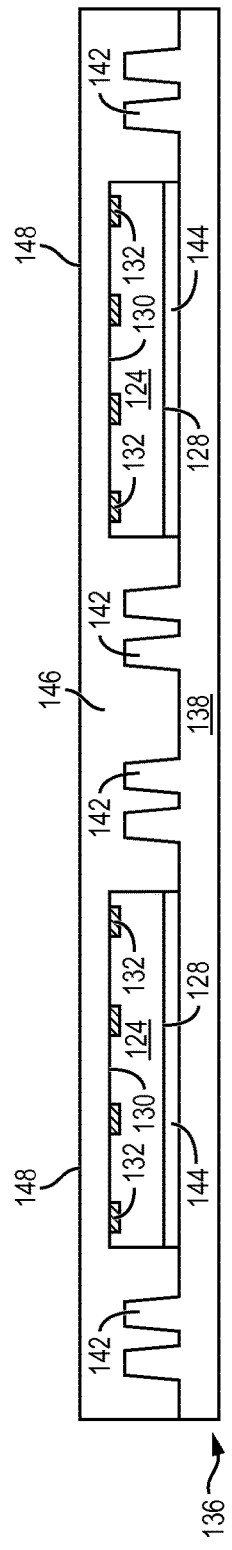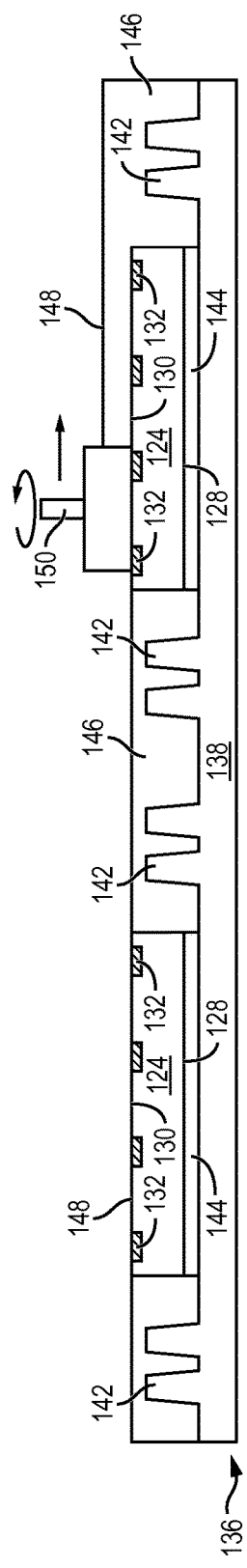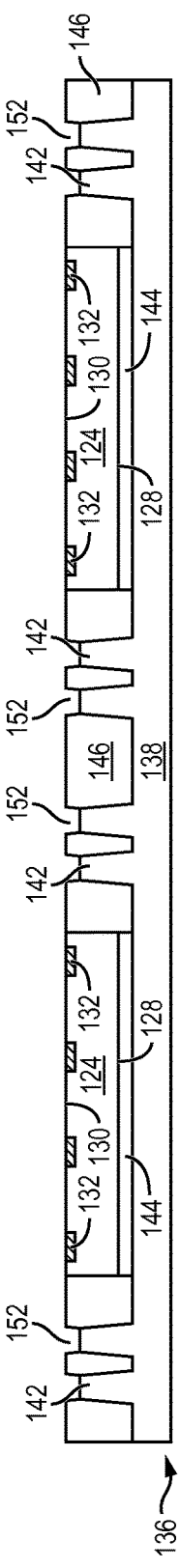

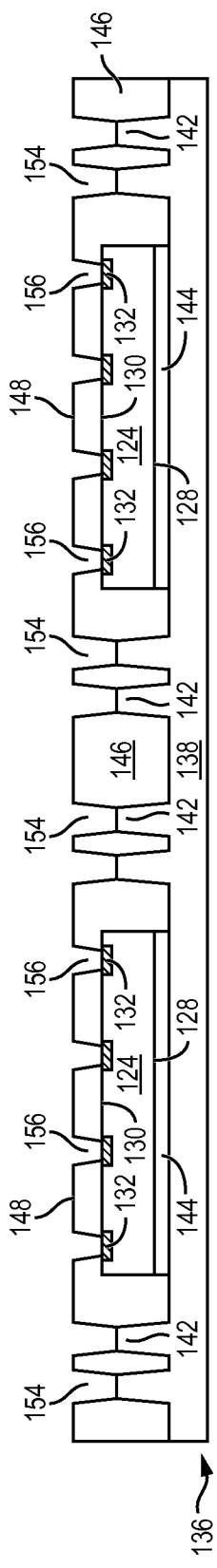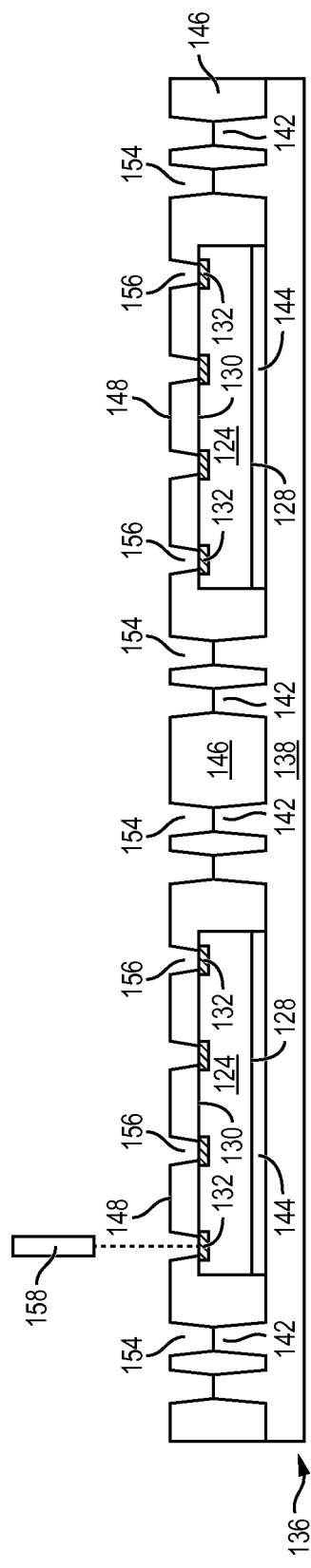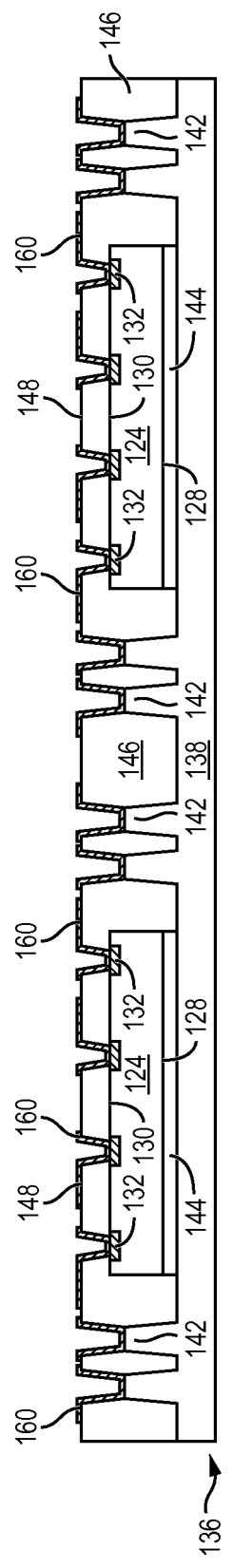

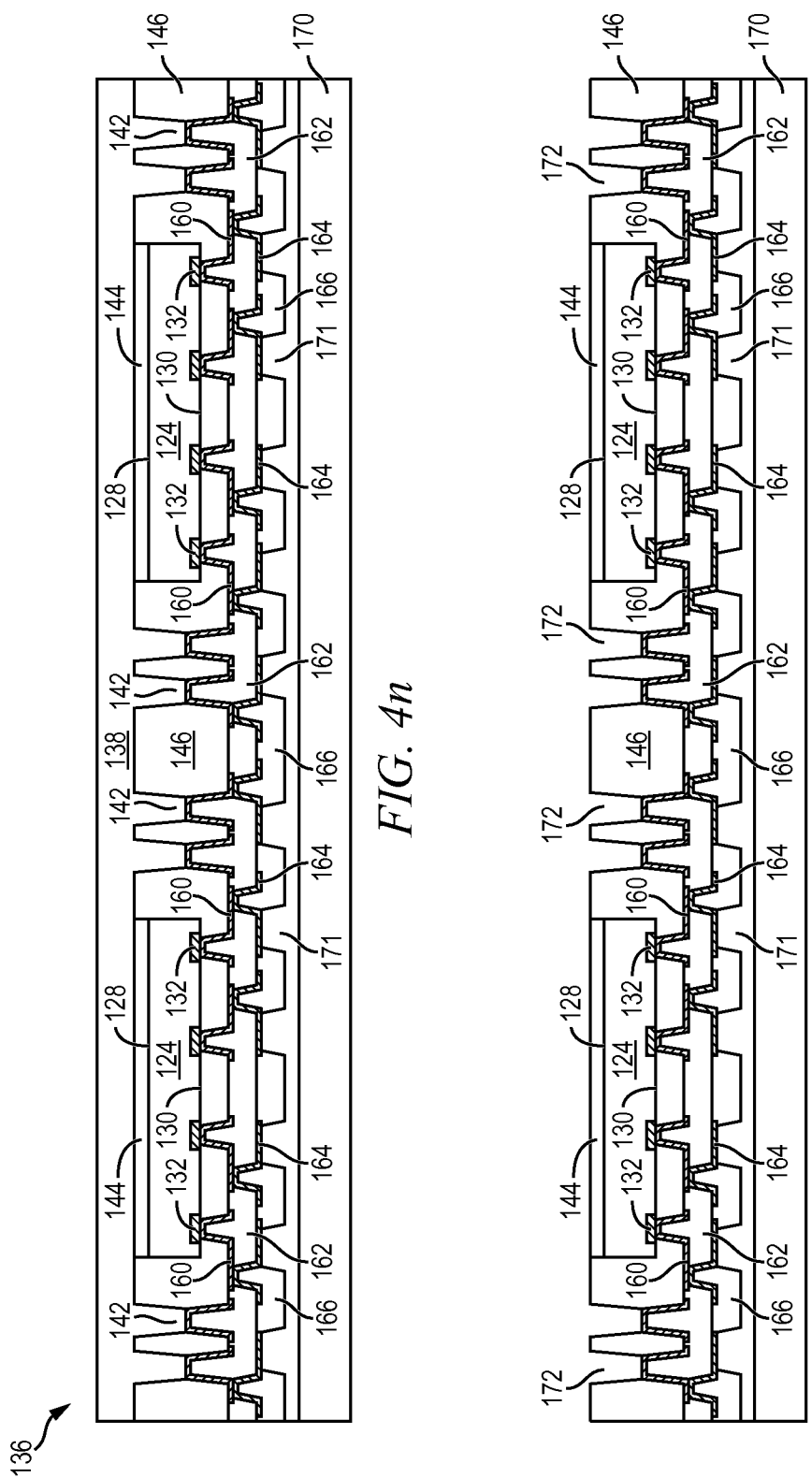

SEMICONDUCTOR DEVICE AND METHOD OF USING LEADFRAME BODIES TO FORM OPENINGS THROUGH ENCAPSULANT FOR VERTICAL INTERCONNECT OF SEMICONDUCTOR DIE

CLAIM TO DOMESTIC PRIORITY

The present application is a continuation of U.S. patent application Ser. No. 13/609,050, now abandoned, filed Sep. 10, 2012, which is a division of U.S. patent application Ser. No. 13/153,286, now U.S. Pat. No. 8,288,209, filed Jun. 3, 2011, which applications are incorporated herein by reference.

FIELD OF THE INVENTION

The present invention relates in general to semiconductor devices and, more particularly, to a semiconductor device and method of using leadframe bodies to form openings through an encapsulant in honeycomb arrangement for vertical interconnect of a semiconductor die.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional fan-out wafer level chip scale package (Fo-WLCSP) may contain a semiconductor die with bumps formed over contact pads on an active surface of the die. The semiconductor die is mounted to a substrate and covered with an encapsulant. Conductive vias are formed through the encapsulant around the substrate for vertical electrical interconnect. However, the formation of conductive vias may involve a time-consuming plating process and is susceptible to voids and other defects. The defects lower manufacturing yield and increase cost.

In another conventional Fo-WLCSP, a leadframe is mounted over a semiconductor and substrate. The leadframe has vertical conductive bodies that are disposed over the substrate and around the semiconductor die. An encapsulant is deposited around the semiconductor die and conductive bodies. When the leadframe is singulated, the conductive bodies are electrically isolated as conductive vias within the encapsulant for vertical interconnect. Warpage is a principal concern for the Fo-WLCSP, as well as defects from electrical shorts.

SUMMARY OF THE INVENTION

A need exists for a simple and cost effective vertical electrical interconnect of a semiconductor die. Accordingly, in one embodiment, the present invention is a semiconductor device comprising a substrate. A semiconductor die is disposed over the substrate. An encapsulant is formed over the substrate and semiconductor die. A first opening is formed in the encapsulant extending to the substrate. A first conductive layer is formed in the opening. A first insulating layer is formed in the opening.

In another embodiment, the present invention is a semiconductor device comprising a first semiconductor die. An encapsulant is deposited over the first semiconductor die. A first conductive layer is formed partially through the encapsulant. An insulating layer is formed over the first conductive layer and partially through the encapsulant. An opening is formed in the encapsulant extending to the first conductive layer.

In another embodiment, the present invention is a semiconductor device comprising a first semiconductor die. An encapsulant is deposited over the first semiconductor die. A first conductive layer is formed partially through the encapsulant. An insulating layer is formed partially through the encapsulant.

In another embodiment, the present invention is a semiconductor device comprising a first semiconductor die. An encapsulant is deposited over the first semiconductor die. A first conductive layer is formed through the encapsulant. An opening is formed in the encapsulant and extending to the first conductive layer.

DETAILED DESCRIPTION OF THE DRAWINGS

Figure 1:
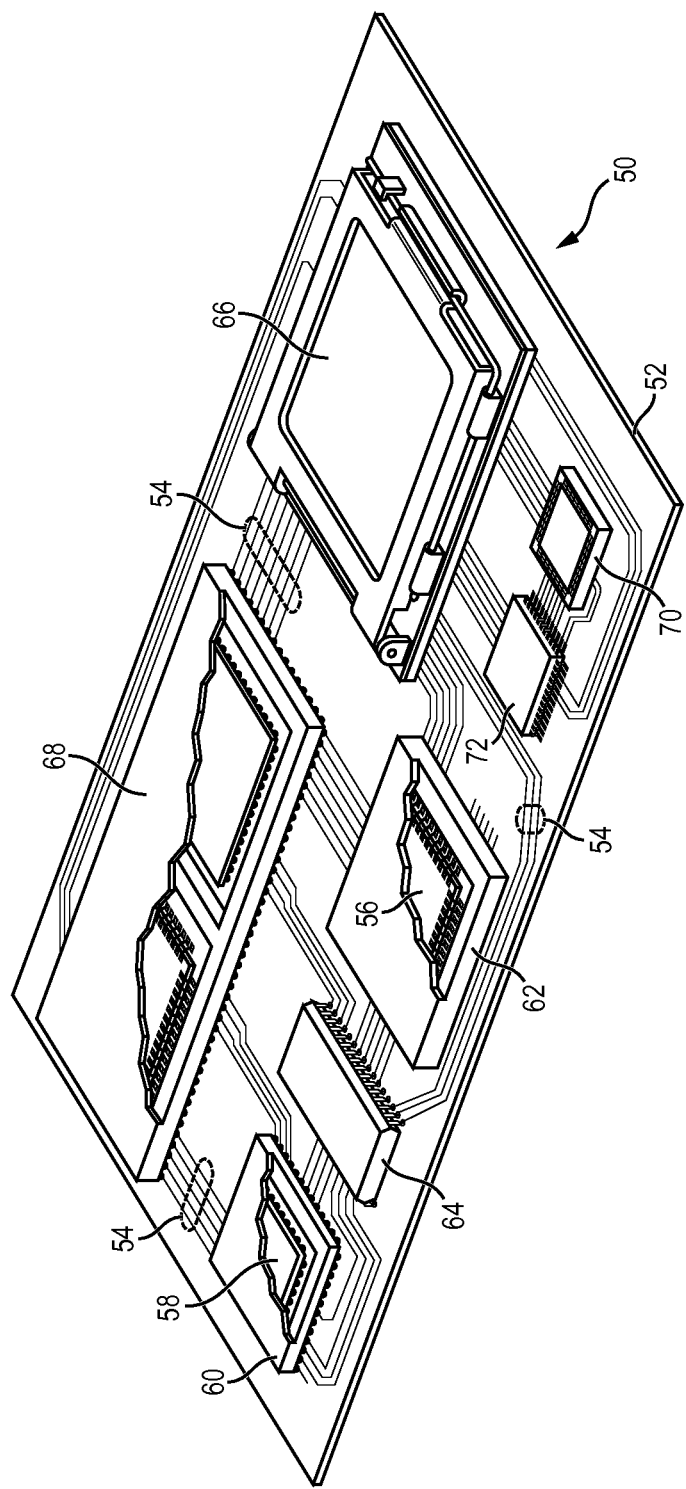
FIG. 1 illustrates a printed circuit board (PCB) with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation.

The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a subcomponent of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
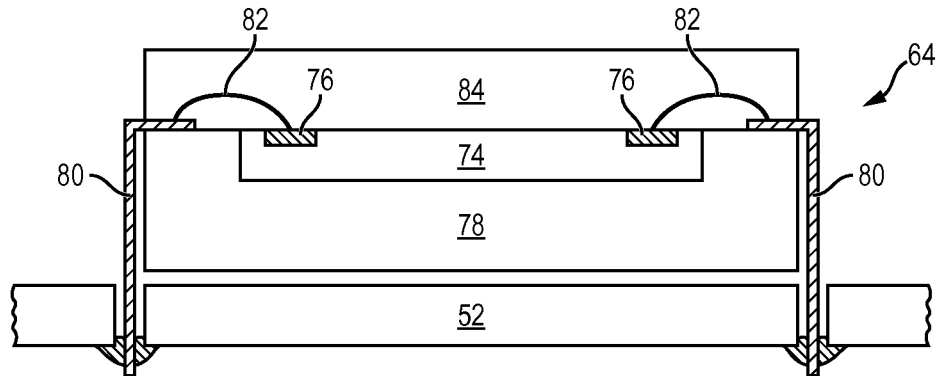
FIGS. 2a-2c illustrate further detail of the representative semiconductor packages mounted to the PCB.
Figure 2B:
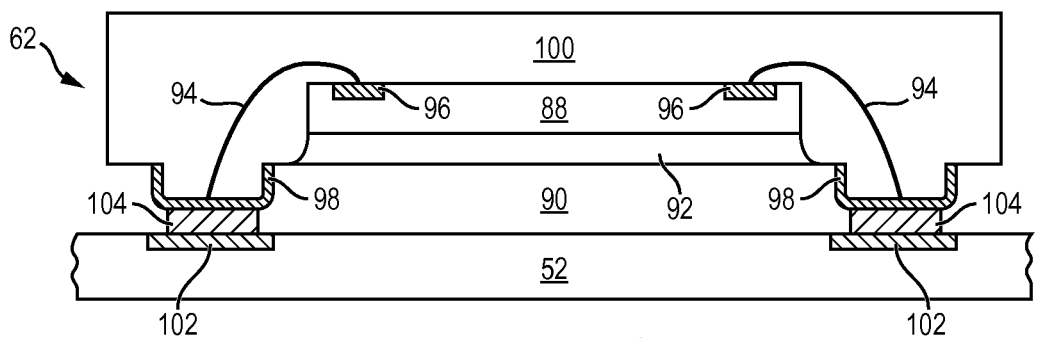
Figure 2C:
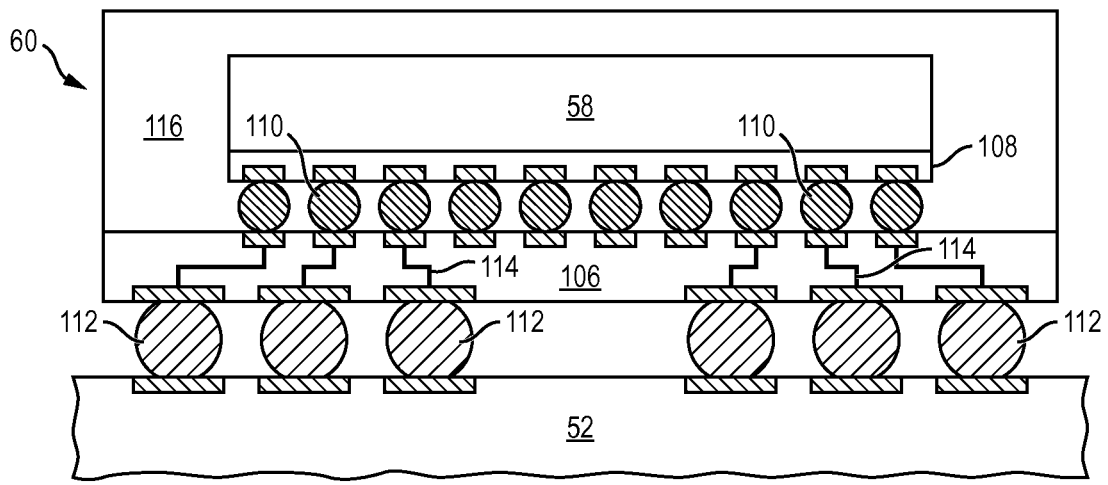

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

Figure 3A:
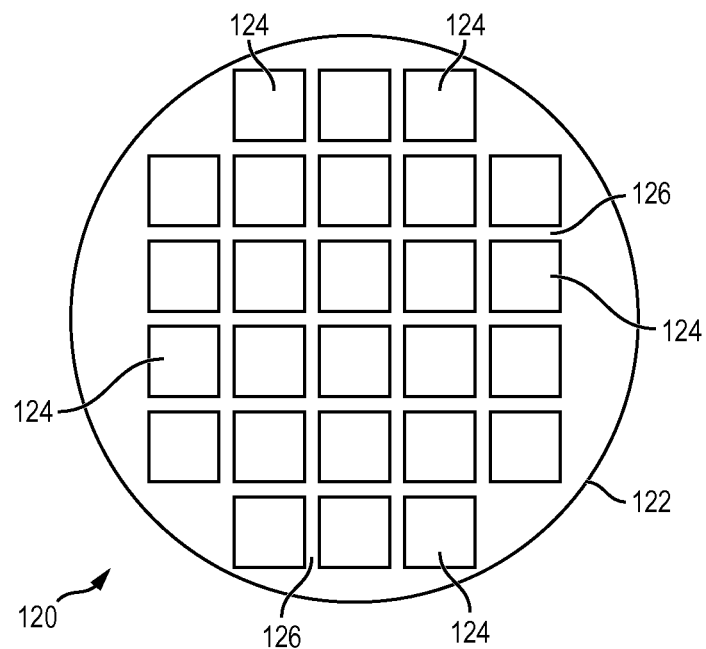
FIGS. 3a-3c illustrate a semiconductor wafer with a plurality of semiconductor die separated by saw streets.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

Figure 3B:
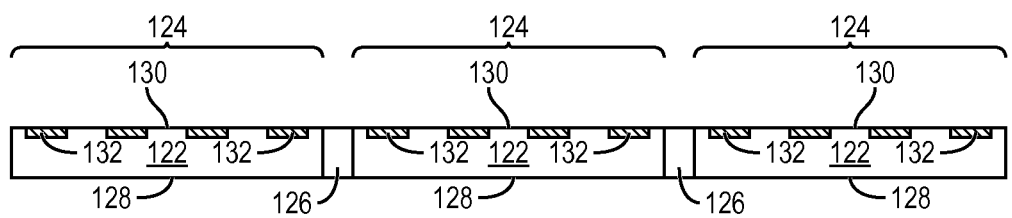

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Contact pads 132 can be disposed side-by-side a first distance from the edge of semiconductor die 124, as shown in FIG. 3b. Alternatively, contact pads 132 can be offset in multiple rows such that a first row of contact pads is disposed a first distance from the edge of the die, and a second row of contact pads alternating with the first row is disposed a second distance from the edge of the die.

Figure 3C:
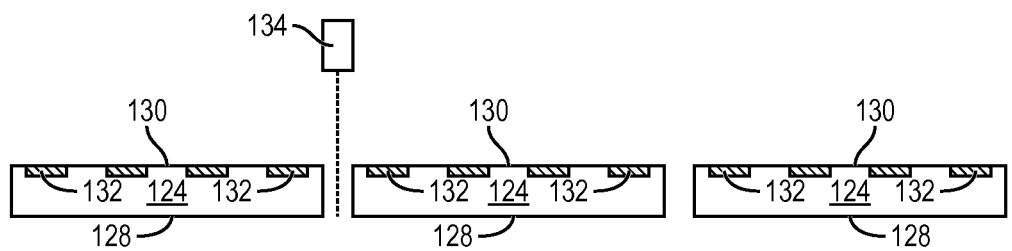

In FIG. 3c, semiconductor wafer 120 is singulated through saw street 126 using a saw blade or laser cutting tool 134 into individual semiconductor die 124.

Figure 4K:
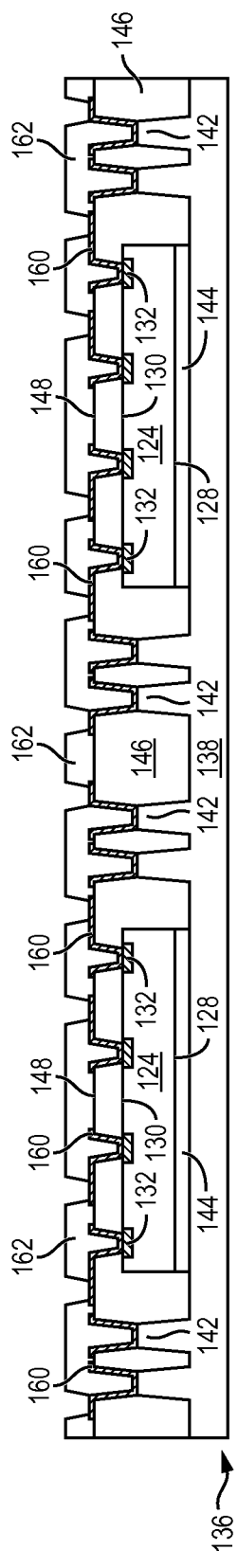
FIGS. 4a-4q illustrate a process of using a leadframe with integrated bodies to form openings through an encapsulant for vertical interconnect of a semiconductor die.
Figure 4L:
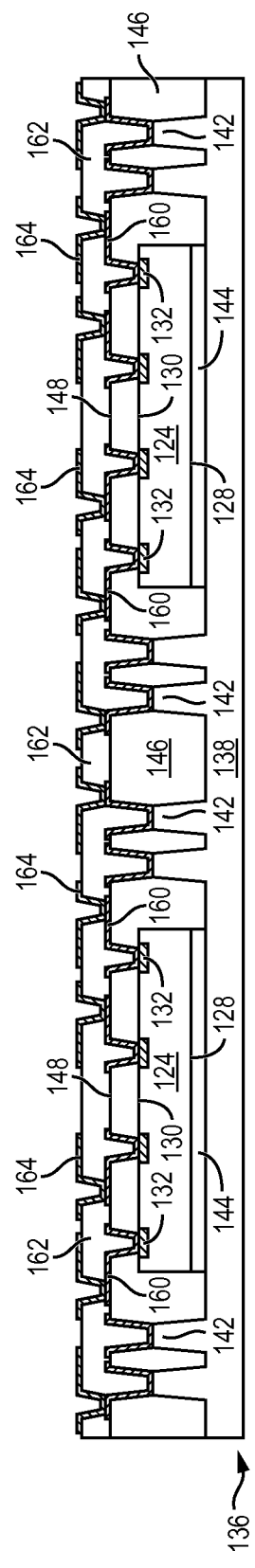
Figure 4M:
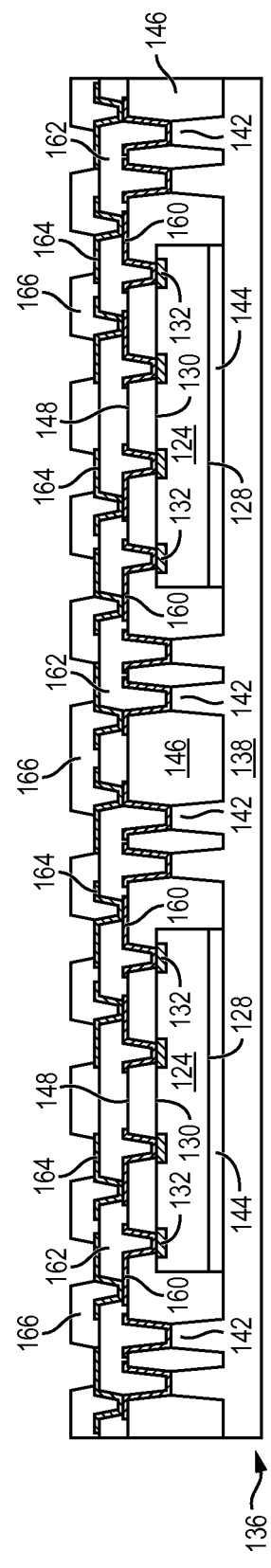
Figure 4P:
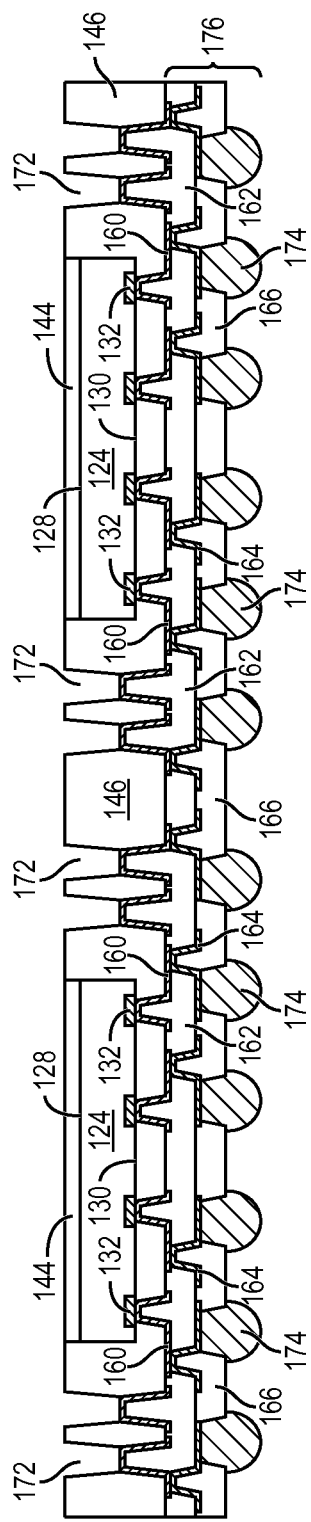
Figure 4Q:
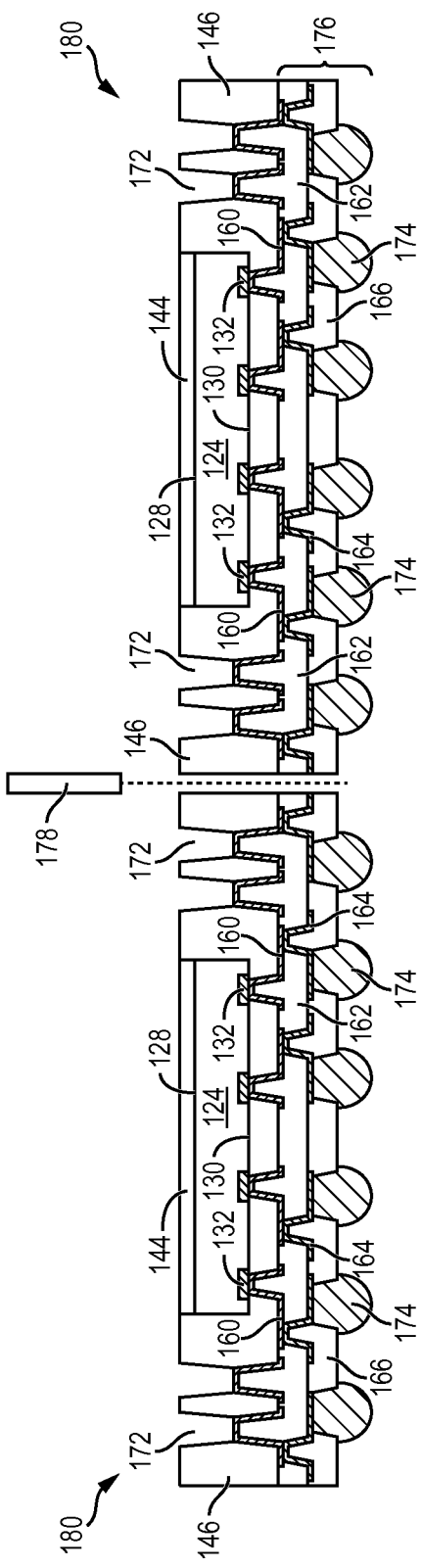

FIGS. 4a-4q illustrate, in relation to FIGS. 1 and 2a-2c, a process of using a leadframe with integrated bodies to form openings through an encapsulant for vertical interconnect of a semiconductor die. FIG. 4a shows a portion of wafer-form or strip form carrier or leadframe 136 having a base plate 138 with die mounting sites 140 and a plurality of bodies 142 integrated with and extending from the base plate. FIG. 4b shows a top view of leadframe 136 with multiple rows of integrated bodies 142 in a honeycomb arrangement around base plate 138. In one embodiment, leadframe 136 is an un-singulated, pre-formed, laminated substrate made with leadframe manufacturing techniques, such as stamping or etching into a single integrated structure. Leadframe 136 can be a pre-plated leadframe (PPF). Leadframe 136 can be gold, silver, nickel, platinum, copper, copper alloys (including one or more elements of nickel, iron, zinc, tin, chromium, silver, and phosphorous), or other suitable conductive materials. Leadframe 136 provides structural support and electrical interconnection for semiconductor die 124.

Alternatively, temporary carrier 136 contains a sacrificial base material such as silicon, germanium, gallium arsenide, indium phosphide, silicon carbide, resin, or other suitable low-cost, rigid material for structural support. Carrier 136 includes die mounting sites 140 and a plurality of bodies 142 extending from the carrier.

In FIG. 4c, semiconductor die 124 from FIGS. 3a-3c are positioned over die mounting site 140 with back surface 128 oriented toward leadframe 136. FIG. 4d shows semiconductor die 124 mounted to die mounting site 140 between bodies 142 of leadframe 136 with die attach adhesive 144, as part of a reconstituted or reconfigured wafer level package. In one embodiment, a vacuum is drawn on base plate 138 of leadframe 136 to reduce warpage during subsequent processing steps.

In FIG. 4e, an encapsulant or molding compound 146 is deposited over semiconductor die 124 and leadframe 136 using a paste printing, compressive molding, transfer molding, liquid encapsulant molding, vacuum lamination, spin coating, or other suitable applicator. Encapsulant 146 can be polymer composite material, such as epoxy resin with filler, epoxy acrylate with filler, or polymer with proper filler. The viscosity of encapsulant 146 is selected for uniform coverage, e.g., a lower viscosity increases the flow of the encapsulant. Encapsulant 146 is non-conductive and environmentally protects the semiconductor device from external elements and contaminants. In another embodiment, a film assist mold (FAM) can be applied over semiconductor die 124 and leadframe 136.

In an optional step, a back surface 148 of encapsulant 146 is planarized by grinder 150 to expose active surface 130 and conductive layer 132, as shown in FIG. 4f. Encapsulant 146 also be planarized by an etching process or CMP to expose active surface 130 and conductive layer 132. In FIG. 4g, a portion of encapsulant 146 is removed by an etching process through a photoresist layer (not shown) to form patterned openings 152 and expose bodies 142 of leadframe 136.

Continuing from FIG. 4e, a portion of encapsulant 146 is removed by an etching process through a photoresist layer to form patterned openings 154 and expose bodies 142, as shown in FIG. 4h. In the same processing step, a portion of encapsulant 146 is removed by an etching process through a photoresist layer to form patterned openings 156 and expose conductive layer 132 of semiconductor die 124.

Alternatively, patterned openings 152-156 can be formed by laser direct ablation (LDA) using laser 158 to remove portions of encapsulant 146 and expose bodies 142 and conductive layer 132 in applications requiring finer interconnect dimensions, as shown in FIG. 4i.

In FIG. 4j, an electrically conductive layer 160 is conformally applied over encapsulant 146, the exposed portion bodies 142, and the exposed conductive layer 132 using a patterning and metal deposition process such as printing, PVD, CVD, sputtering, electrolytic plating, and electroless plating. Conductive layer 160 can be one or more layers of Al, Cu, Sn, Ti, Ni, Au, Ag, or other suitable electrically conductive material. Conductive layer 160 follows the contour of encapsulant 146, including into openings 154 and 156. In one embodiment, conductive layer 160 includes an adhesion layer, barrier layer, and seed or wetting layer. One portion of conductive layer 160 is electrically connected to conductive layer 132. Other portions of conductive layer 160 can be electrically common or electrically isolated depending on the design and function of semiconductor die 124.

In FIG. 4k, an insulating or dielectric layer 162 is formed over encapsulant 146 and conductive layer 160 using PVD, CVD, printing, spin coating, spray coating, lamination, sintering or thermal oxidation. The insulating layer 162 contains one or more layers of silicon dioxide ($SiO_2$), silicon nitride ($Si_3N_4$), silicon oxynitride (SiON), tantalum pentoxide ($Ta_2O_5$), aluminum oxide ($Al_2O_3$), benzocyclobutene (BCB), polyimide (PI), polybenzoxazoles (PBO), or other suitable dielectric material. A portion of insulating layer 162 is removed by an etching process through a photoresist layer to expose conductive layer 160.

In FIG. 4l, an electrically conductive layer 164 is conformally applied over conductive layer 160 and insulating layer 162 using a patterning and metal deposition process such as printing, PVD, CVD, sputtering, electrolytic plating, and electroless plating. Conductive layer 164 can be one or more layers of Al, Cu, Sn, Ti, Ni, Au, Ag, or other suitable electrically conductive material. Conductive layer 164 follows the contour of conductive layer 160 and insulating layer 162. In one embodiment, conductive layer 164 includes an adhesion layer, barrier layer, and seed or wetting layer. One portion of conductive layer 164 is electrically connected to conductive layer 160. Other portions of conductive layer 164 can be electrically common or electrically isolated depending on the design and function of semiconductor die 124.

In FIG. 4m, an insulating or passivation layer 166 is formed over insulating layer 162 and conductive layer 164 using PVD, CVD, printing, spin coating, spray coating, lamination, sintering or thermal oxidation. The insulating layer 166 contains one or more layers of SiO2, Si3N4, SiON, Ta2O5, Al2O3, or other material having similar insulating and structural properties. A portion of insulating layer 166 is removed by an etching process through a photoresist layer to expose conductive layer 164.

FIG. 4n shows a temporary substrate or carrier 170 containing sacrificial base material such as silicon, polymer, beryllium oxide, or other suitable low-cost, rigid material for structural support. An interface layer or double-sided tape 171 is formed over carrier 170 as a temporary adhesive bonding film or etch-stop layer. The reconstituted or reconfigured wafer level package in FIG. 4m is mounted to interface layer 171 and carrier 170 with insulating layer 166 oriented toward the carrier.

In FIG. 4o, leadframe 136 is removed by an etching process, leaving openings 172 in encapsulant 146 in a honeycomb arrangement to expose conductive layer 160. In other words, it is the space previously occupied by bodies 142 of leadframe 136 within encapsulant 146 that forms openings 172 in encapsulant 146 once the leadframe and bodies are removed.

In FIG. 4p, carrier 170 and interface layer 171 are removed by chemical etching, mechanical peeling, CMP, mechanical grinding, thermal bake, UV light, laser scanning, or wet stripping to expose conductive layer 164 and insulating layer 166.

An electrically conductive bump material is deposited over conductive layer 164 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive layer 164 using a suitable attachment or bonding process. In one embodiment, the bump material is reflowed by heating the material above its melting point to form balls or bumps 174. In some applications, bumps 174 are reflowed a second time to improve electrical contact to conductive layer 164. An under bump metallization (UBM) layer can be formed under bumps 174. Bumps 174 can also be compression bonded to conductive layer 164. Bumps 174 represent one type of interconnect structure that can be formed over conductive layer 164. The interconnect structure can also be stud bumps, micro bumps, or other electrical interconnect.

Alternatively, leadframe 136 is removed after forming bumps 174. The combination of conductive layers 160 and 164, insulating layers 162 and 166, and bumps 174 constitutes a build-up interconnect structure 176.

In FIG. 4q, the reconstituted or reconfigured wafer level package in FIG. 4p is singulated through encapsulant 146 and build-up interconnect structure 176 with saw blade or laser cutting tool 178 into individual fan-out wafer level chip scale packages (Fo-WLSCP) 180.

Figure 5:
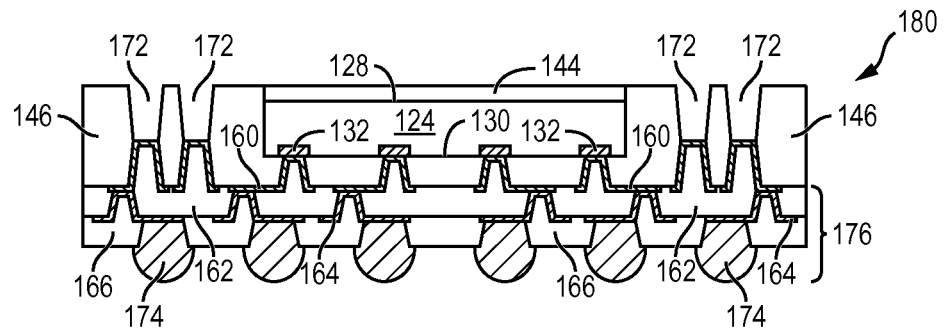
FIG. 5 illustrates a Fo-WLCSP with openings formed through an encapsulant using a leadframe with integrated bodies for vertical interconnect of a semiconductor die.

FIG. 5 shows Fo-WLCSP 180 after singulation. Semiconductor die 124 is electrically connected through build-up interconnect structure 176 to external devices. The openings 172 formed by removing bodies 142 of leadframe 136 from encapsulant 146 provide an interconnect path to conductive layer 160 from a side of Fo-WLCSP 180 opposite build-up interconnect structure 176.

Figure 6A:
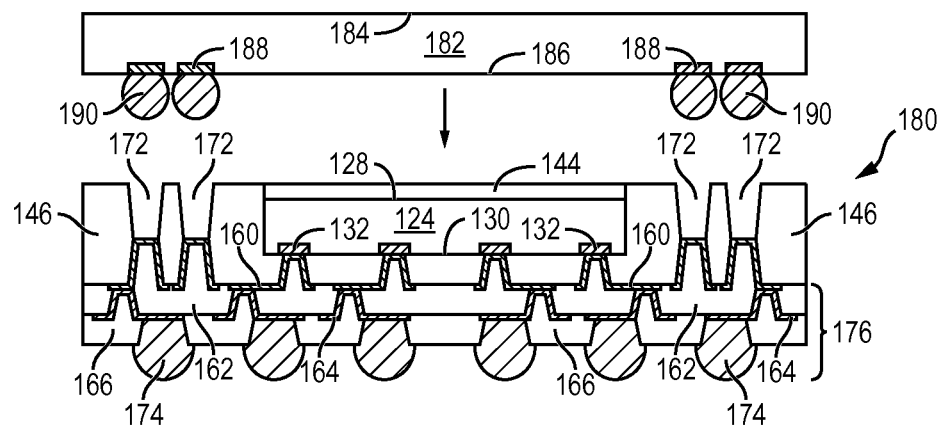
FIGS. 6a-6b illustrate a PoP arrangement with a semiconductor die mounted to the Fo-WLCSP.
Figure 6B:
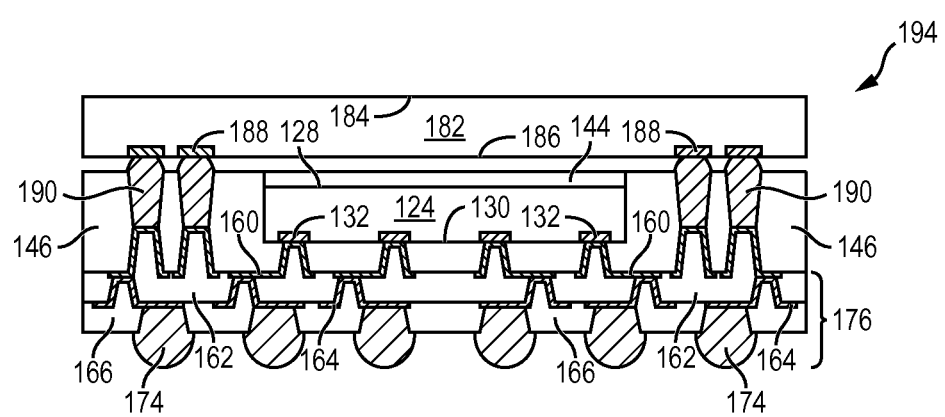

FIGS. 6a-6b illustrate a semiconductor die or package 182 mounted to Fo-WLCSP 180. In FIG. 6a, a semiconductor die 182 originating from a semiconductor wafer, similar to FIGS. 3a-3c, has a back surface 184 and active surface 186 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 186 to implement analog circuits or digital circuits, such as DSP, ASIC, memory, or other signal processing circuit. Semiconductor die 182 may also contain IPDs, such as inductors, capacitors, and resistors, for RF signal processing. A plurality of contact pads 188 is formed on active surface 186 and electrically connected to the circuits on the active surface. A plurality of bumps 190 is formed over contact pads 188. In one embodiment, semiconductor die 182 is a flipchip type die.

Semiconductor die 182 is positioned over Fo-WLCSP 180 with active surface 186 oriented toward the Fo-WLCSP and bumps 190 aligned with the honeycomb arrangement of openings 172. Bumps 190 are reflowed into openings 172 over the exposed conductive layer 160 of build-up interconnect structure 176 to metallurgically and electrically connect semiconductor die 182 to Fo-WLCSP 180. FIG. 6b shows semiconductor die 182 mounted to Fo-WLCSP 180 in a package-on-package (PoP) arrangement 194. The honeycomb arrangement of openings 172 aids with alignment and mounting of semiconductor die 182 to Fo-WLCSP 180. With bumps 190 partially contained within openings 172, the overall height of PoP arrangement 194 is reduced, and there is less occurrence of bridging between adjacent bumps during reflow. Alternatively, a discrete active or passive component can be mounted to Fo-WLCSP 180.

Figure 7:
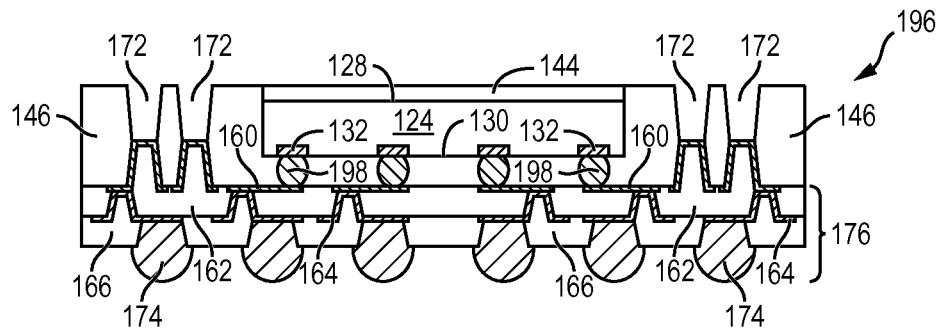
FIG. 7 illustrates the Fo-WLCSP with bumps formed on the semiconductor die.

FIG. 7 illustrates another embodiment of Fo-WLCSP 196, similar to FIG. 5, with a plurality of bumps 198 formed over conductive layer 132 of semiconductor die 124, prior to mounting the semiconductor die to leadframe 136, see FIGS. 4c-4d. Bumps 198 are metallurgically and electrically connected to conductive layer 160 of build-up interconnect structure 176.

Figure 8:
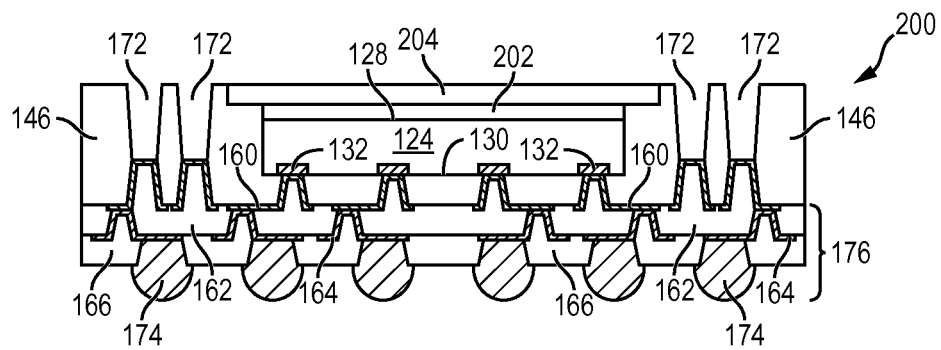
FIG. 8 illustrates the Fo-WLCSP with a TIM and heat spreader mounted over the semiconductor die.

FIG. 8 illustrates another embodiment of Fo-WLCSP 200, similar to FIG. 5, with a thermal interface material (TIM) 202 deposited over back surface 128 of semiconductor die 124. TIM 202 is a thermal epoxy, thermal epoxy resin, or thermal conductive paste. Heat spreader or heat sink 204 is positioned over and mounted to TIM 202 over semiconductor die 124. Heat spreader 204 can be Cu, Al, or other material with high thermal conductivity. Heat spreader 204 and TIM 202 form a thermally conductive path that distributes and dissipates the heat generated by the high frequency electronic components of semiconductor die 124 and increases the thermal performance of semiconductor package 200. The heat is dissipated radially from heat spreader 204.

Figure 9:
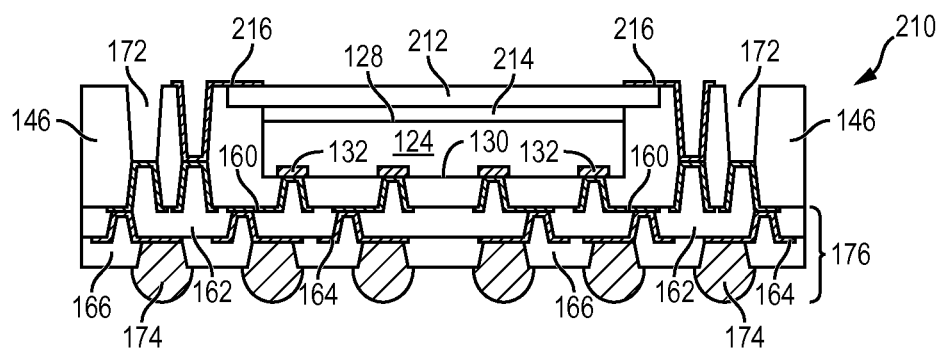
FIG. 9 illustrates the Fo-WLCSP with a shielding layer mounted over the semiconductor die.

FIG. 9 illustrates another embodiment of Fo-WLCSP 210, similar to FIG. 5, with an electromagnetic interference (EMI) or radio frequency interference (RFI) shielding layer 212 formed over back surface 128 of semiconductor die 124. Semiconductor die 124 may contain baseband circuits that generate EMI, RFI, or other inter-device interference, such as capacitive, inductive, or conductive coupling. In other embodiments, semiconductor die 124 contains IPDs that are susceptible to EMI, RFI, and inter-device interference. For example, the IPDs contained within semiconductor die 124 provide the electrical characteristics needed for high frequency applications, such as resonators, high-pass filters, low-pass filters, band-pass filters, symmetric Hi-Q resonant transformers, and tuning capacitors. The IPDs can be used as front-end wireless RF components, which can be positioned between the antenna and transceiver. The IPD inductor can be a hi-Q balun, transformer, or coil, operating up to 100 Gigahertz. In some applications, multiple baluns are formed on a same substrate, allowing multi-band operation. For example, two or more baluns are used in a quad-band for mobile phones or other global system for mobile (GSM) communications, each balun is dedicated for a frequency band of operation of the quad-band device. A typical RF system requires multiple IPDs and other high frequency circuits in one or more semiconductor packages to perform the necessary electrical functions.

To reduce the effects of EMI and RFI, a shielding layer 212 positioned over and mounted over semiconductor die 124 with an adhesive layer 214. Shielding layer 212 can be one or more layers of Al, Cu, ferrite or carbonyl iron, stainless steel, nickel silver, low-carbon steel, silicon-iron steel, foil, conductive resin, conductive paste, and other metals and composites capable of blocking or absorbing EMI, RFI, and other inter-device interference. In another embodiment, shielding layer 212 can be a non-metal material such as carbon-black or aluminum flake to reduce the effects of EMI and RFI. Shielding layer 212 is grounded through conductive layer 216 formed in openings 172 and build-up interconnect structure 176 to an external low impedance ground point.

Figure 10A:
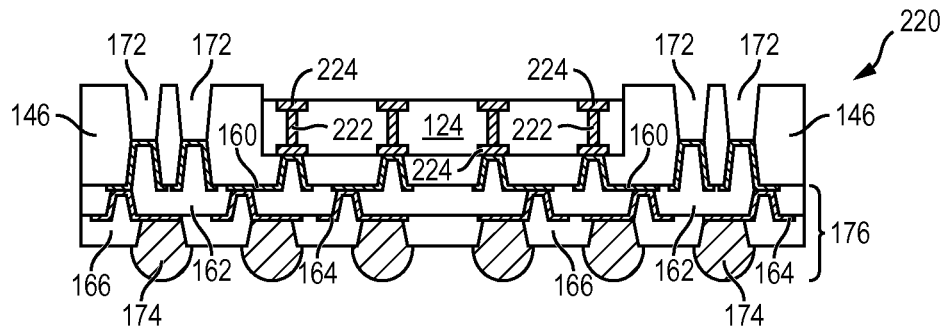
FIGS. 10a-10c illustrate a PoP arrangement with a semiconductor die mounted to a Fo-WLCSP containing a TSV semiconductor die.
Figure 10B:
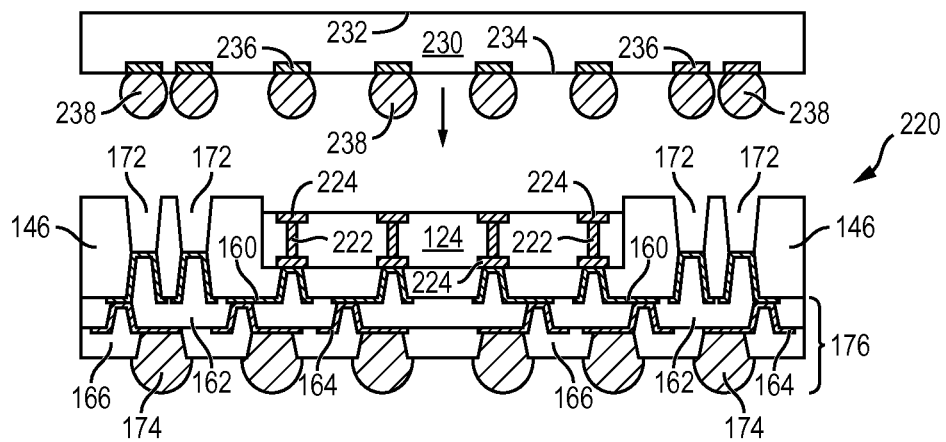
Figure 10C:
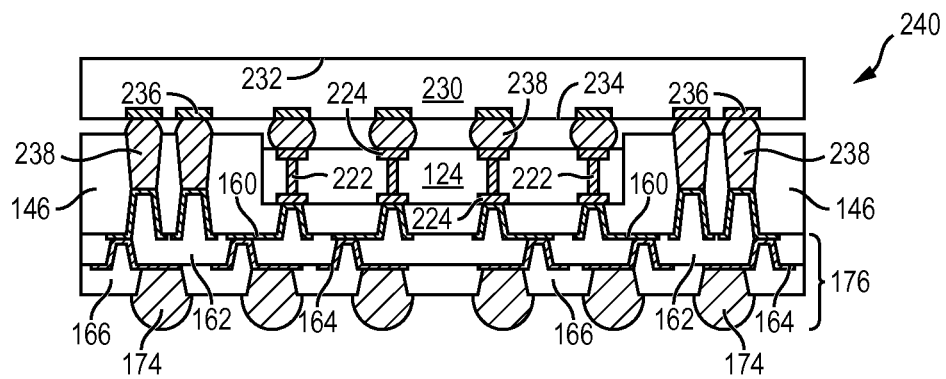

FIGS. 10a-10c illustrates another embodiment of forming a PoP arrangement. FIG. 10a shows semiconductor die 124 contained within Fo-WLCSP 220, similar to FIG. 5. A plurality of vias is formed through semiconductor die 124 while in wafer form, see FIGS. 3a-3c, using laser drilling, mechanic drilling, etching, or DRIE. The vias are filled with Al, Cu, Sn, Ni, Au, Ag, Ti, W, poly-silicon, or other suitable electrically conductive material using electrolytic plating, electroless plating process, or other suitable metal deposition process to form z-direction vertical interconnect conductive through silicon vias (TSV) 222. Conductive TSV 222 are electrically connected to conductive layer 132 and conductive layer 224 formed on back surface 128 of TSV semiconductor die 124. In another embodiment, two TSV semiconductor die are stacked back surface to back surface and electrically connected through the conductive TSVs.

In FIG. 10b, a semiconductor die 230 originating from a semiconductor wafer, similar to FIGS. 3a-3c, has a back surface 232 and active surface 234 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 234 to implement analog circuits or digital circuits, such as DSP, ASIC, memory, or other signal processing circuit. Semiconductor die 230 may also contain IPDs, such as inductors, capacitors, and resistors, for RF signal processing. A plurality of contact pads 236 is formed on active surface 234 and electrically connected to the circuits on the active surface. A plurality of bumps 238 is formed over contact pads 236. In one embodiment, semiconductor die 230 is a flipchip type die.

Semiconductor die 230 is positioned over Fo-WLCSP 220 with active surface 234 oriented toward the Fo-WLCSP and bumps 238 aligned with the honeycomb arrangement of openings 172. Bumps 238 are reflowed into openings 172 over the exposed conductive layer 160 of build-up interconnect structure 176 to metallurgically and electrically connect semiconductor die 230 to Fo-WLCSP 220. FIG. 10c shows semiconductor die 230 mounted to Fo-WLCSP 220 in a PoP arrangement 240. The honeycomb arrangement of openings 172 aids with alignment and mounting of semiconductor die 230 to Fo-WLCSP 220. With bumps 238 partially contained within openings 172, the overall height of PoP arrangement 240 is reduced, and there is less occurrence of bridging between adjacent bumps during reflow. Alternatively, a discrete active or passive component can be mounted to Fo-WLCSP 220.

Figure 11A:
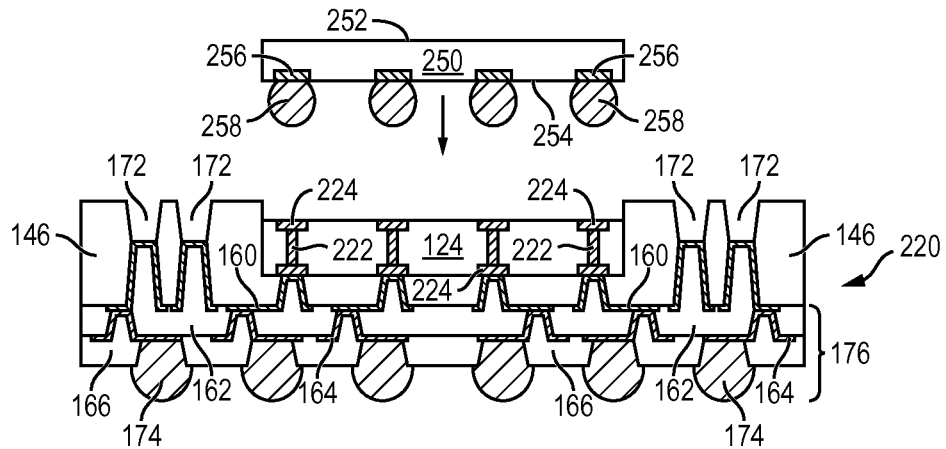
FIGS. 11a-11c illustrate a PoP arrangement with two semiconductor die mounted to a Fo-WLCSP containing a TSV semiconductor die.
Figure 11B:
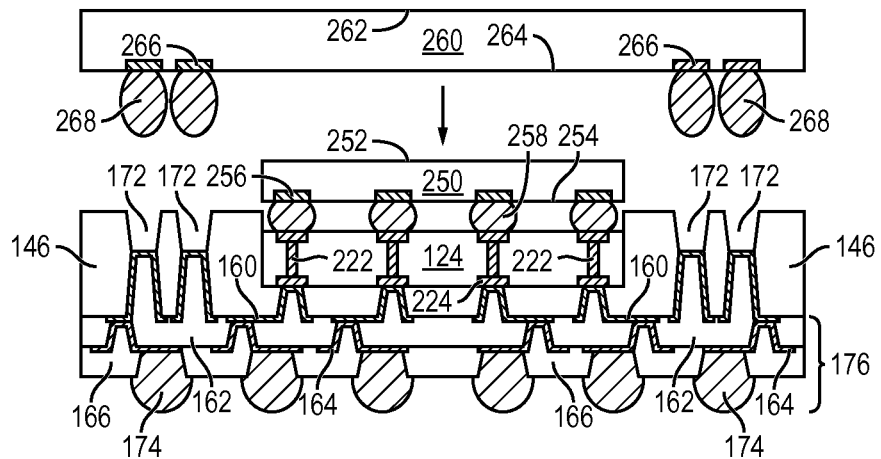
Figure 11C:
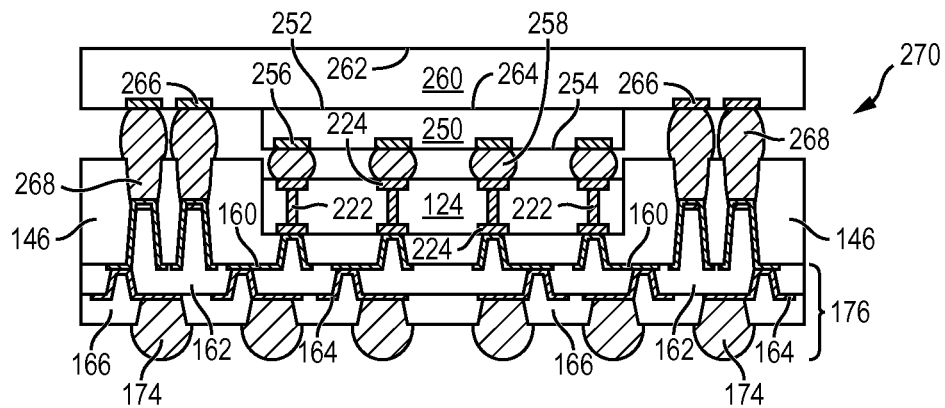

FIGS. 11a-11c illustrate another embodiment of forming a PoP arrangement. Continuing from FIG. 10a, a semiconductor die 250 originating from a semiconductor wafer, similar to FIGS. 3a-3c, has a back surface 252 and active surface 254 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 254 to implement analog circuits or digital circuits, such as DSP, ASIC, memory, or other signal processing circuit. Semiconductor die 250 may also contain IPDs, such as inductors, capacitors, and resistors, for RF signal processing. A plurality of contact pads 256 is formed on active surface 254 and electrically connected to the circuits on the active surface. A plurality of bumps 258 is formed over contact pads 256. In one embodiment, semiconductor die 250 is a flipchip type die.

In FIG. 11a, semiconductor die 250 is positioned over TSV semiconductor die 124 with active surface 254 oriented toward the Fo-WLCSP and bumps 258 aligned with conductive layer 224. Bumps 258 are reflowed over conductive layer 224 to metallurgically and electrically connect semiconductor die 250 to TSV semiconductor die 124. FIG. 11b shows semiconductor die 250 mounted to TSV semiconductor die 124.

A semiconductor die 260 originating from a semiconductor wafer, similar to FIGS. 3a-3c, has a back surface 262 and active surface 264 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 264 to implement analog circuits or digital circuits, such as DSP, ASIC, memory, or other signal processing circuit. Semiconductor die 260 may also contain IPDs, such as inductors, capacitors, and resistors, for RF signal processing. A plurality of contact pads 266 is formed on active surface 264 and electrically connected to the circuits on the active surface. A plurality of bumps 268 is formed over contact pads 266. In one embodiment, semiconductor die 260 is a flipchip type die.

Semiconductor die 260 is positioned over Fo-WLCSP 220 and semiconductor die 250 with active surface 264 oriented toward the Fo-WLCSP and bumps 268 aligned with the honeycomb arrangement of openings 172. Bumps 268 are reflowed into openings 172 over the exposed conductive layer 160 of build-up interconnect structure 176 to metallurgically and electrically connect semiconductor die 260 to Fo-WLCSP 220. FIG. 11c shows semiconductor die 260 mounted to Fo-WLCSP 220 in a PoP arrangement 270. The honeycomb arrangement of openings 172 aids with alignment and mounting of semiconductor die 260 to Fo-WLCSP 220. With bumps 268 partially contained within openings 172, the overall height of PoP arrangement 270 is reduced, and there is less occurrence of bridging between adjacent bumps during reflow.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a substrate as a single material including a base plate and a row of first bodies and a row of second bodies extending from a surface of the base plate, wherein the surface of the base plate completely surrounds each of the row of first bodies and each of the row of second bodies;
   a semiconductor die disposed between the row of first bodies and the row of second bodies;
   an encapsulant deposited around the semiconductor die and over the substrate around each of the row of first bodies and each of the row of second bodies, wherein the encapsulant includes a plurality of first openings extending to each of the row of first bodies and to each of the row of second bodies;
   a conductive layer formed in at least one of the first openings and contacting at least one of the row of first bodies; and
   an insulating layer formed over the encapsulant and extending into the at least one of the first openings over the conductive layer.

2. The semiconductor device of claim 1, wherein the substrate consists of a non-conductive material.

3. The semiconductor device of claim 1, further including a second opening formed in the encapsulant and extending to the semiconductor die.

4. The semiconductor device of claim 3, wherein the conductive layer extends into the second opening to contact the semiconductor die.

5. The semiconductor device of claim 1, wherein a surface of the encapsulant is coplanar with a surface of the semiconductor die.

6. The semiconductor device of claim 1, further including a conductive via formed through the semiconductor die.

7. A semiconductor device, comprising:
   a semiconductor die;
   an encapsulant deposited around the semiconductor die, wherein the encapsulant includes a plurality of first openings arranged in a row and formed from a first surface of the encapsulant partially through the encapsulant;
   a conductive layer formed over the first surface of the encapsulant and extending into the first openings in the encapsulant; and
   an insulating layer formed over the conductive layer and extending into the first openings over the conductive layer;
   wherein the encapsulant includes a plurality of second openings arranged in a row and formed from a second surface of the encapsulant opposite the first surface of the encapsulant partially through the encapsulant and aligned with the first openings and extending to the conductive layer.

8. The semiconductor device of claim 7, further including a substrate formed as a single material including a base plate and a row of first bodies and a row of second bodies extending from a surface of the base plate, wherein the surface of the base plate completely surrounds each of the row of first bodies and each of the row of second bodies and further that the row of first bodies and the row of second bodies are disposed in the second openings in the encapsulant.

9. The semiconductor device of claim 8, wherein the substrate consists of a non-conductive material.

10. The semiconductor device of claim 7, further including a third opening in the encapsulant extending to the semiconductor die.

11. The semiconductor device of claim 10, wherein the conductive layer extends into the third opening to contact the semiconductor die.

12. The semiconductor device of claim 10, wherein the third opening exposes an entire surface of the semiconductor die.

13. The semiconductor device of claim 7, further including a conductive via formed through the semiconductor die.

14. A semiconductor device, comprising:
    a semiconductor die;
    an encapsulant deposited around the semiconductor die, wherein the encapsulant further includes a plurality of first openings arranged in a row and formed from the first surface of the encapsulant partially through the encapsulant; and
    a conductive layer formed over the first surface of the encapsulant and extending into the first openings in the encapsulant;
    wherein the encapsulant includes a plurality of second openings arranged in a row and formed from a second surface of the encapsulant opposite the first surface of the encapsulant partially through the encapsulant and aligned with the first openings and extending to the conductive layer.

15. The semiconductor device of claim 14, further including a substrate formed as a single material including a base plate and a row of first bodies and a row of second bodies extending from the base plate, wherein the row of first bodies and the row of second bodies are disposed in the second openings in the encapsulant.

16. The semiconductor device of claim 15, wherein the substrate consists of a non-conductive material.

17. The semiconductor device of claim 14, further including a third opening formed in the encapsulant and extending to the semiconductor die.

18. The semiconductor device of claim 17, wherein the third opening exposes an entire surface of the semiconductor die.

19. The semiconductor device of claim 14, further including a conductive via formed through the semiconductor die.

20. The semiconductor device of claim 14, further including an insulating layer formed over the conductive layer and extending into the first openings over the conductive layer.

21. A semiconductor device, comprising:
a substrate formed as a single material including a base plate and a row of first bodies and a row of second bodies extending from the base plate with a die mounting site on the base plate disposed between the row of first bodies and the row of second bodies;
a semiconductor die disposed over the die mounting site;
an encapsulant deposited around the semiconductor die and over the substrate around each of the row of first bodies and each of the row of second bodies, wherein the encapsulant further includes a plurality of first openings arranged in a row and formed from the first surface of the encapsulant partially through the encapsulant and extending to each of the row of first bodies and to each of the row of second bodies; and
a conductive layer formed in at least one of the first openings and contacting at least one of the row of first bodies or at least one of the row of second bodies.

22. The semiconductor device of claim 21, wherein the substrate consists of a non-conductive material.

23. The semiconductor device of claim 21, further including an insulating layer formed over the conductive layer and extending into the at least one of the first openings over the conductive layer.

24. The semiconductor device of claim 21, further including a conductive via formed through the semiconductor die.

* * * * *